(12) United States Patent
    Romback

(10) Patent No.: US 6,411,125 B1
(45) Date of Patent: Jun. 25, 2002

(54) CMOS BUS DRIVER CIRCUIT

(75) Inventor: Gerd Romback, Freising (DE)

(73) Assignee: Texas Instruments Deutschlqand GmbH, Freising (DE)

( * ) Notice: Subject to any disclaimer, the term of this patent is extended or adjusted under 35 U.S.C. 154(b) by 0 days.

(21) Appl. No.: 09/886,826

(22) Filed: Jun. 21, 2001

(30) Foreign Application Priority Data

Jun. 30, 2000 (DE) .......................................... 100 31 837

(51) Int. Cl.[7] .......................................... H03K 19/0175
(52) U.S. Cl. .............................. 326/81; 326/68; 326/83; 326/57
(58) Field of Search .............................. 326/57, 58, 68, 326/81, 83

(56) References Cited

U.S. PATENT DOCUMENTS 5,338,978 A * 8/1994 Larsen et al. ................ 307/443
5,600,267 A * 2/1997 Wong et al. ................... 326/73

* cited by examiner

Primary Examiner—Michael Tokar
Assistant Examiner—Anh Q. Tran
(74) Attorney, Agent, or Firm—Bret J. Petersen; Frederick J. Telecky, Jr.; W. James Brady

(57) ABSTRACT

A CMOS bus driver circuit includes an output stage of two complementary MOS transistors and an input stage, where in the connection of the source-drain paths of the MOS transistors (P1, N1) of the input stage a diode (D) is inserted so that the flow of a current in the direction of the MOS transistor (P1) connected to the supply voltage terminal (14) of the input stage is blocked, its cathode being connected to the gate of the one MOS transistor (P2) of the output stage. Connected in parallel to the diode D is the source-drain path of a further MOS transistor (P4), the gate of which is connected to the circuit output (18).

6 Claims, 1 Drawing Sheet

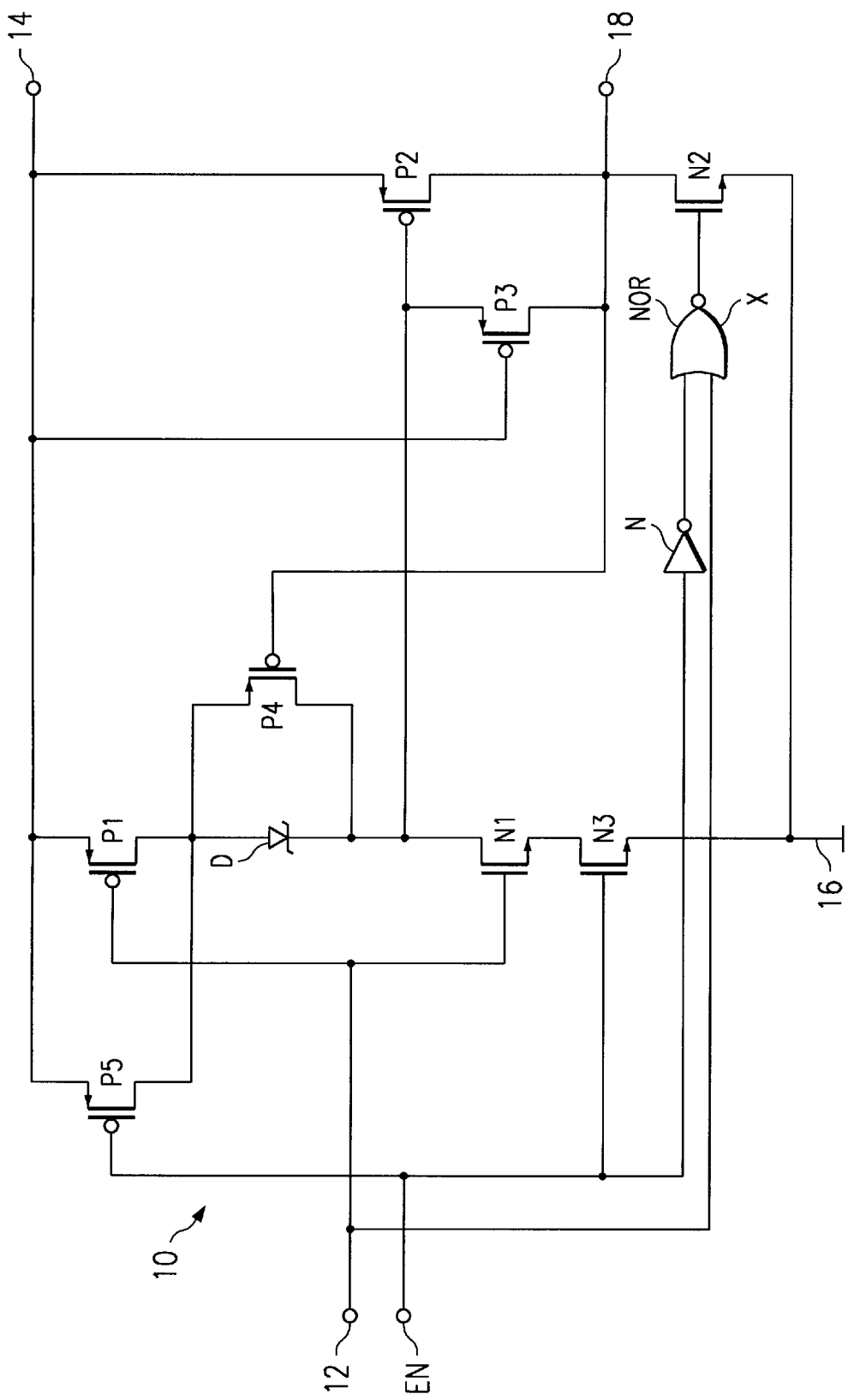

CMOS BUS DRIVER CIRCUIT

FIELD OF THE INVENTION

The invention generally relates to bus driver circuits and more specifically to a CMOS bus driver circuit.

BACKGROUND OF THE INVENTION

It is usual in integrated circuits to interconnect circuit units or also integrated circuits as a whole via a bus, a driver circuit being used as each stage coupling the circuit units and the bus. In modern integrated circuits these driver circuits are configured as CMOS driver circuits in which both the input stage and the output stage consist of two complementary MOS transistors connected in series. This means that in the output stage the source-drain path of a PMOS transistor and the source-drain path of an NMOS transistor are connected in series between a supply voltage terminal and a ground terminal, the connection of the two source-drain paths forming the circuit output. Since a variety of driver circuits are connected to the bus it may result in actual practice that a voltage occurs at the circuit output of a bus driver which is higher than the supply voltage of such a bus driver, this being especially the case when circuit units of several integrated circuit modules or integrated circuits each designed for a differing supply voltage are connected to a bus. Thus, it may happen that a driver applies to the bus a signal whose voltage value is higher than the supply voltage of another driver likewise connected to the bus.

In integrated circuits the PMOS transistor of the output stage is as a rule an enhancement-type transistor in which the gate voltage always needs to be the highest voltage existing in the circuit so that this transistor can be switched OFF. Should it happen, however, that the drain of this transistor receive from the bus a voltage which is higher than the supply voltage of the driver, then voltage is available to permit switching the PMOS transistor OFF by being applied to the gate. Indeed, the ON condition of the PMOS transistor materializing in this case could even result in it being ruined.

SUMMARY OF THE INVENTION

The invention is thus based on the objective of providing a CMOS bus driver circuit of the aforementioned kind which at modest circuit expense is protected should a voltage be applied to the circuit output which is higher than the available supply voltage.

In an embodiment of the invention, a circuit output and the gate of a MOS transistor of the output stage the gate-source path of a further MOS transistor of the same channel type is connected whose gate is connected to the supply voltage terminal, that in the connection of the source-drain paths of the MOS transistors of the input stage a diode is inserted so that the flow of a current in the direction of the MOS transistor connected to the supply voltage terminal of the input stage is blocked, its cathode being connected to the gate of the one MOS transistor of the output stage, and that a blocking circuit component is provided which sets the output stage into a high impedance state when the driver circuit is not supplied with an enable signal for bus driving.

BRIEF DESCRIPTION OF THE DRAWING

FIG. 1: the sole FIGURE is a circuit diagram of the CMOS bus driver circuit in accordance with the invention.

DETAILED DESCRIPTION OF THE INVENTION

Referring now to this FIGURE there is illustrated a bus driver circuit 10 containing an input stage comprising a PMOS transistor P1 and an NMOS transistor N1. The gates of these two transistors are connected to each other and form a circuit input 12 of the bus driver circuit 10. The source-drain paths of the two transistors are inserted in series between a supply voltage terminal 14 and a ground terminal 16 with a diode D in-between. In this arrangement the diode D is inserted between the two source-drain paths so that a flow of current in the direction of the PMOS transistor P1 is prevented.

The bus driver circuit 10 contains furthermore an output stage including a PMOS transistor P2 and an NMOS transistor N2 whose source-drain paths are connected in series between the supply voltage terminal 14 and ground terminal 16. The point connecting the two source-drain paths forms the circuit output 18 of the bus driver circuit 10. The gate of the PMOS transistor P2 is connected to the point connecting the drain of the NMOS transistor N1 and the cathode of the diode.

Connected between the gate of the PMOS transistor P2 and the circuit output 18 is the source-drain path of a further PMOS transistor P3 whose gate is connected to the supply voltage terminal 14. Connected in parallel to the diode D is the source drain path of a further PMOS transistor P4, the gate of which is connected to the circuit output 18.

Connected in parallel to the source-drain path of the PMOS transistor P1 is the source-drain path of a further PMOS transistor P5 whose gate is connected to the gate of an NMOS transistor N3, the source-drain path of which is connected between the source of the NMOS transistor N1 and ground. The connected gates of the PMOS transistor P5 and NMOS transistor N3 are connected via a negator N to an input of a NOR circuit X, the other input of which is connected to the circuit input 12. The output stage of the NOR circuit X is connected to the gate of the NMOS transistor N2. In addition, the connected gates of the PMOS transistor P5 and NMOS transistor N3 are connected to an enable input EN.

The way in which the bus driver circuit 10 works as shown in the drawing will firstly be described for the case in which a HI signal is applied to the enable input EN and with no voltage appearing at the bus connected to the circuit output 18 which is higher than the supply voltage of the bus driver circuit applied to the supply voltage terminal 14. Due to the HI signal at the enable input EN PMOS transistor P5 is switched OFF and NMOS transistor N3 is switched ON. Via the negator N a LO signal is applied to the one input of the NOR circuit. Assuming now a LO signal is required to be applied to the output stage of the circuit and thus to the circuit output 18, then since the bus driver circuit has no inverting effect this is achieved by a LO signal likewise being applied to the circuit input 12, resulting in PMOS transistor P1 being switched ON while NMOS transistor N1 is switched OFF. A high voltage thus appears at the gate of the PMOS transistor P2 which switches this transistor OFF. Via the NOR circuit X a high voltage signal appears at the gate of the NMOS transistor N2 which switches this transistor ON, resulting in, as desired, the LO signal appearing at the circuit output 18 which is thus applied to the bus. The LO signal at the circuit output 18 results in PMOS transistor P3, whose gate is connected to the supply voltage, being switched OFF while the PMOS transistor P4 is switched ON. It is due to PMOS transistor P4 being switched ON that the diode D is short-circuited, i.e. taken out of circuit.

Should the circuit output 18 be required to produce a HI signal to be applied to the bus, then the circuit input 12 also needs to receive such a HI signal. The transistors P1, P2, P4, N1 and N2 in the driver circuit change state, whereas the transistors P5, N3 forming with the NOR circuit a blocking circuit component do not change state since the HI signal is still applied to the enable input EN, PMOS transistor P3 likewise remaining OFF since its gate is applied to the highest voltage appearing in the circuit, namely the supply voltage.

Considering now the situation in which the driver circuit is deactivated by a LO signal applied to the enable input EN and in which a voltage is applied to the circuit output 18 via the bus from another driver circuit which is higher than the supply voltage at the supply voltage terminal, then a LO signal at the enable input EN results in NMOS transistors N2 and N3 being switched OFF. As mentioned above, PMOS transistor P2 must always be switched opposite in state to that of the NMOS transistor N2 when the HI signal or the LO signal appears at the circuit output 18, i.e. also when the voltage coming from the bus is higher than the supply voltage. The PMOS transistor P2 can thus only be reliably switched OFF when its gate receives the highest voltage available, i.e. normally the voltage at the supply voltage terminal 14. If the voltage at the circuit output 18 then assumes a higher value than the supply voltage it is normally no longer possible to switch PMOS transistor P2 OFF by applying its gate to the supply voltage. However, in the bus driver circuit as shown in the drawing PMOS transistor P3 ensures that in this case the higher voltage at circuit output 18 is applied to the gate of PMOS transistor P2, resulting in this being reliably switched OFF. PMOS transistor P3 changes to the ON condition due to the higher voltage at the circuit output 18 so that this output voltage appears via the source-drain path at the gate of the PMOS transistor P2.

Since, as already mentioned, NMOS transistors N2 and N3 are already OFF due to the LO signal at the enable input EN there is no flow of current from the circuit output 18 via the PMOS transistor P3 and the NMOS transistor N1, neither to ground terminal 16 nor to the supply voltage terminal 14 since this is prevented, on the one hand, by the NMOS transistor N3 being OFF and, on the other, by the diode D. The circuit output 18 thus has a high impedance relative to the bus so that no current can flow from the bus into the driver circuit. Since in this arrangement the PMOS transistor P3 is ON, PMOS transistor P2 is reliably switched OFF in the output circuit stage so that it cannot be ruined by a current flowing from the circuit output 18 to the supply voltage terminal 14.

Without PMOS transistor P4 the diode D would negatively influence the bus driver circuit under normal circumstances, i.e. when no voltage appears at the circuit output 18 higher in value than the supply voltage. The forward voltage of the diode equal to or higher than the threshold voltage of PMOS transistor P2 would prevent this PMOS transistor being switched OFF totally when a LO signal is required at the circuit output 18. However, it is particularly in latest technology in the fabrication of integrated circuits that the threshold voltages of the field-effect transistors are assuming ever smaller values while the forward voltage of the diodes remains constant, resulting in this becoming a serious problem. Since, however, in the cited case the diode is bypassed by PMOS transistor P4 so that its forward voltage can have no effect, PMOS transistor P2 can be reliably switched OFF quickly.

In the bus driver circuit as described, it is reliably prevented under all circumstances that a current flows from the supply voltage terminal 14 via the PMOS transistor P2 and NMOS transistor N2 to ground, this applying also to the critical case when the voltage at the circuit output 18 is higher than the supply voltage. Short-circuiting the diode D with the aid of PMOS transistor P4 ensures in this case that the transition into the OFF condition takes place very quickly. For the switching actions the full supply voltage range can be exploited which is particularly of advantage when the supply voltage range assumes small values.

What is claimed is:

1. A CMOS bus driver circuit comprising an input stage of two complementary MOS transistors (P1,N1), as well as an output stage of two complementary MOS transistors(P2, N2) with an output 18, characterized in that the connection of the source-drain paths of said MOS transistors of said input stage a diode (D) is inserted so that the flow of a current in the direction of said MOS transistor (P1) connected to a supply voltage terminal (14) of said input stage is blocked, its cathode being connected to the gate of said one MOS transistor (P2) of said output stage, and that a blocking circuit component (N3, P5, X) is provided which sets said output stage (P2, N2) into a high impedance state when said driver circuit is not supplied with an enable input EN signal for bus driving.

2. The CMOS bus driver circuit as set forth in claim 1, characterized in that said blocking circuit component contains connected in parallel to MOS transistor (P1) a MOS transistor (P5) of the same channel type in the input stage, a further MOS transistor (N3) of the opposite channel type between the two MOS transistors of the input stage and the ground terminals (16) and a NOR circuit (X), the one input of said NOR circuit (X) being connected to said circuit input (12), the other input being connected to the output of said negator (N) and the output of said NOR circuit (X) being connected to the gate of the other MOS transistor (N2), and the gates of said MOS transistors (P5, N3) as well as the input of said negator (N) being connected to an enable input (EN).

3. The CMOS bus driver circuit as set forth in claim 2 characterized in that connected in parallel to said diode (D) is the source-drain path of a MOS transistor (P4) whose gate is connected to said circuit output (18).

4. A CMOS bus driver circuit comprising an input stage of two complementary MOS transistors, the source-drain paths of which are connected in series between a supply voltage terminal and a ground terminal and whose connected gates form the input of the circuit, as well as an output stage of two complementary MOS transistors, the source-drain paths of which are likewise connected in series between a supply voltage terminal and a ground terminal, the gate of the one MOS transistor of the output stage being connected to the point connecting the source-drain paths of the MOS transistors of the input stage, while the gate of the other MOS transistor of the output stage is connected via a negator to the input of the circuit and the point connecting the source-drain paths of the two MOS transistors of the output stage forms the output stage of the circuit, characterized in that that between said circuit output (18) and the gate of a MOS transistor (P2) of said output stage the gate-source path of a further MOS transistor (P3) of the same channel type is connected whose gate is connected to said supply voltage terminal (14), that in the connection of the source-drain paths of said MOS transistors of said input stage a diode (D) is inserted so that the flow of a current in the direction of said MOS transistor (P1) connected to said supply voltage terminal (14) of said input stage is blocked, its cathode being connected to the gate of said one MOS transistor (P2) of said output stage, and that a blocking circuit component (N3, P5, X) is provided which sets said output stage (P2, N2) into a high impedance state when said driver circuit is not supplied with an enable input EN signal for bus driving.

5. The CMOS bus driver circuit as set forth in claim 4, characterized in that said blocking circuit component contains connected in parallel to MOS transistor (P1) a MOS transistor (P5) of the same channel type in the input stage, a further MOS transistor (N3) of the opposite channel type between the two MOS transistors of the input stage and the ground terminals (16) and a NOR circuit (X), the one input of said NOR circuit (X) being connected to said circuit input (12), the other input being connected to the output of said negator (N) and the output of said NOR circuit (X) being connected to the gate of the other MOS transistor (N2), and the gates of said MOS transistors (P5, N3) as well as the input of said negator (N) being connected to an enable input (EN).

6. The CMOS bus driver circuit as set forth in claim 5, characterized in that connected in parallel to said diode (D) is the source-drain path of a MOS transistor (P4) whose gate is connected to said circuit output (18).

* * * * *